(12) United States Patent
Nakai et al.

(10) Patent No.: US 6,998,861 B2
(45) Date of Patent: Feb. 14, 2006

(54) WIRING BOARD AND SOLDERING METHOD THEREFOR

(75) Inventors: Mitsuhisa Nakai, Kusatsu (JP); Keiichi Kuriyama, Osaka (JP); Akihiro Kyogoku, Kyoto (JP); Yoshinao Nakamoto, Kusatsu (JP); Koji Taniguchi, Koga-gun (JP); Hiroaki Higashi, Omihachiman (JP)

(73) Assignee: Matsushita Electric Industrial Co., Inc., Kadoma (JP)

( * ) Notice: Subject to any disclaimer, the term of this patent is extended or adjusted under 35 U.S.C. 154(b) by 280 days.

(21) Appl. No.: 10/311,993

(22) PCT Filed: Apr. 26, 2002

(86) PCT No.: PCT/JP02/04293

§ 371 (c)(1),
(2), (4) Date: Feb. 11, 2003

(87) PCT Pub. No.: WO02/089544

PCT Pub. Date: Nov. 7, 2002

(65) Prior Publication Data

US 2003/0156391 A1 Aug. 21, 2003

(30) Foreign Application Priority Data

Apr. 27, 2001 (JP) .................................. 2001-131466

(51) Int. Cl.
*G01R 31/02* (2006.01)

(52) U.S. Cl. .................... 324/755; 324/158.1; 361/761

(58) Field of Classification Search ................ 324/513, 324/755, 758, 158.1; 174/260–263, 250; 228/179.1, 180.1, 180.5; 361/748, 760–761, 361/767, 774–777
See application file for complete search history.

(56) References Cited

U.S. PATENT DOCUMENTS 5,010,448 A * 4/1991 Kobari ...................... 361/767
5,679,929 A * 10/1997 Greenfield et al. ......... 174/261
5,877,033 A * 3/1999 Matern ....................... 438/14

FOREIGN PATENT DOCUMENTS

| JP | 2-54598 | | 2/1990 |
| JP | 05315733 A | * | 11/1993 |
| JP | 6-164120 | | 6/1994 |
| JP | 8-323495 | | 12/1996 |
| JP | 11-251725 | | 9/1999 |
| JP | 2000-40869 | | 2/2000 |

* cited by examiner

*Primary Examiner*—Minh N. Tang
(74) *Attorney, Agent, or Firm*—Steptoe & Johnson LLP

(57) ABSTRACT

A circuit board for surface mounting by solder flow an electronic component having narrow lead pitches, the board having a first solder leading land having a first side and located on the circuit board adjacent to a land for mounting an electronic component, and a second solder leading land located next to the first solder leading land and opposite the first side of the first solder leading land. A method for flow soldering a surface mounted electronic component on such a circuit board, wherein the second solder leading land is positioned at a rear end of the circuit board against a direction of a movement of the circuit board when the circuit board moves toward a solder flow.

10 Claims, 7 Drawing Sheets

Circuit board moving direction in flow soldering

Circuit board moving direction in flow soldering

Circuit board moving direction in flow soldering

Circuit board moving direction in flow soldering

Side view

Circuit board moving direction in flow soldering

Circuit board moving direction in flow soldering

PRIOR ART    FIG. 6
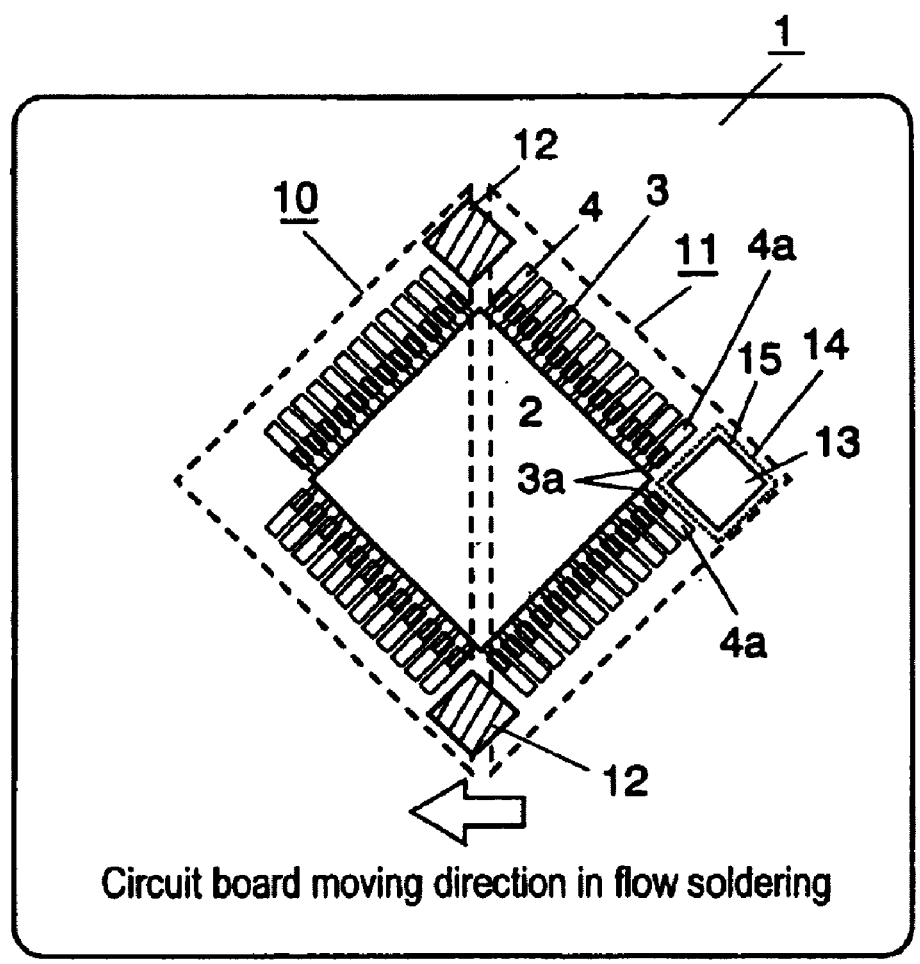
Circuit board moving direction in flow soldering

PRIOR ART  FIG. 7A
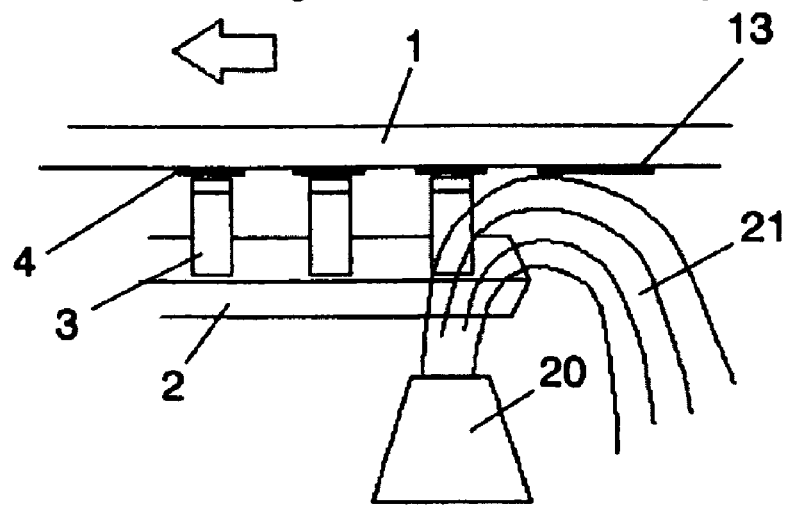
PRIOR ART  FIG. 7B
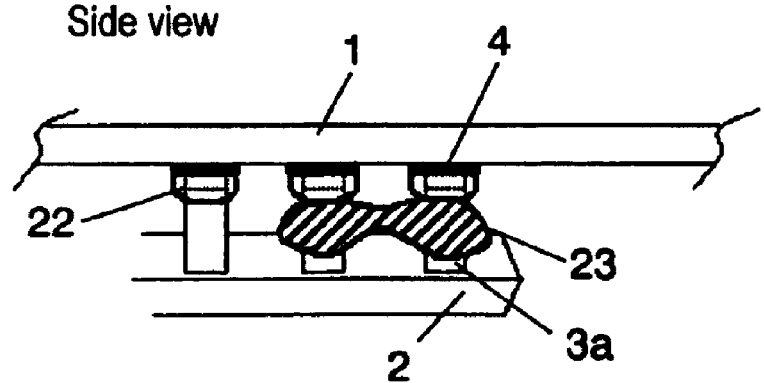

025B
WIRING BOARD AND SOLDERING METHOD THEREFOR

TECHNICAL FIELD

The present invention relates to a circuit board on which surface electronic components are mounted by soldering at narrow lead pitches as is the case with quad flat package integrated circuits (hereinafter, QFPIC). More specifically, the present invention relates to a circuit board preferable for mounting electronic components at narrow lead pitches by a flow soldering method.

BACKBROUND ART

As an example of narrow-pitch mounting of electronic components, a conventional flow soldering method for QFPIC is described with reference to FIG. 6. A QFPIC 2, a surface-mount component, is approximately square shaped with a plurality of leads 3 aligned along its four sides. Lands 4 are disposed on a circuit board 1 in such a manner that they correspond with the leads 3. Since the leads 3 are disposed at fine pitches, solder bridges often occur between leads during flow soldering. The solder bridges occur more easily when pins are disposed successively at right angles to a direction in which the circuit board moves during the flow soldering. To avoid the solder bridges, as illustrated in FIG. 6, QFPIC is soldered at an angle of 45 degrees against the direction the circuit board moves during flow soldering. This construction allows a flow of solder to come in contact with leads and lands sequentially from a front to a rear side, and consequently promotes the flow.

Another method of preventing the solder bridge uses a land called solder leading land which is formed at a rear portion of each side of QFPIC 2 against the direction in which the circuit board moves for the soldering. In this method, mid solder leading lands 12 and a rear side solder leading land 13 are formed respectively near QFPIC 2 in between groups of leads and lands 10 and 11 lining up respectively along the two sides in the front side and two sides in the rear side, and at the rear end of the groups of leads and lands 11 located along the two rear sides near QFPIC 2.

FIG. 7A is a schematic diagram showing a side view of the circuit board 1. As shown in FIG. 7A, by leading solder 21 which has flowed out from a flow soldering nozzle 20, over leads and lands sequentially to the solder leading land 13 by using surface tension, excessive accumulation of solder in the section of leads and lands is prevented from occurring. This principle works for both mid solder leading lands 12 and rear side solder leading land 13.

However, mounting electronic components by flow soldering at narrow lead pitches as is the case with QFPIC still entails challenges regarding how to lead an excessive solder built up around leads 3a and lands 4a located at the rear ends of each side, to the solder leading land 13. The amount of solder for two lines of leads in the rear side accumulates around the rear ends of the sides of QFPIC against the direction in which the circuit board moves during flow soldering. This promotes formation of solder bridges between leads as well as lands, and thus requires expertise regarding selection of optimum shape of lands for the rear solder leading land. In FIG. 7B, an example of appropriate soldering is indicated by numeral 22. Around a final lead 3a however, excessive solder may cause solder bridge 23 between leads.

In the case of lead-free solder which has been recently attracting attention as an environmentally-friendly solder, the above described problem is experienced more often due to the reasons described below.

Since lead-free solder does not contain lead which carries the important role as an agent to help lower the melting point and improve fluidity and wettability, its fluidity and wettability is lower, thus solder bridges are formed more frequently.

In a process of mass production of the circuit boards, when a solder bridge is formed during the process of the flow soldering, the problem needs to be repaired manually in a following process. As a result, required man-hours are increased, and yields lowered. Furthermore, excessive heat stress associated with manual soldering poses a possibility of damaging components.

The present invention provides a circuit board and its manufacturing method which address the conventional problems described above and achieves smooth flow soldering for QFPIC.

DISCLOSURE OF THE INVENTION

The circuit board of the present invention comprises a first solder leading land disposed at a portion on a circuit board corresponding to a corner of a QFPIC which is to be mounted, and a second solder leading land disposed approximately opposite to the QFPIC side of the first solder leading land.

While the circuit board is soldered by a flow soldering method, the circuit board is moved toward a flow solder tank in such a manner that the corner where the first and the second solder leading lands are disposed is located at a tail.

BRIEF DESCRIPTION OF THE DRAWINGS

FIG. 6 is a schematic diagram showing a circuit board of a prior art.

FIG. 7A is a schematic diagram showing a QFP solder leading land.

FIG. 7B is a schematic diagram showing a function of the QFP solder leading land.

BEST MODE FOR CARRYING OUT THE INVENTION

Figure 1:
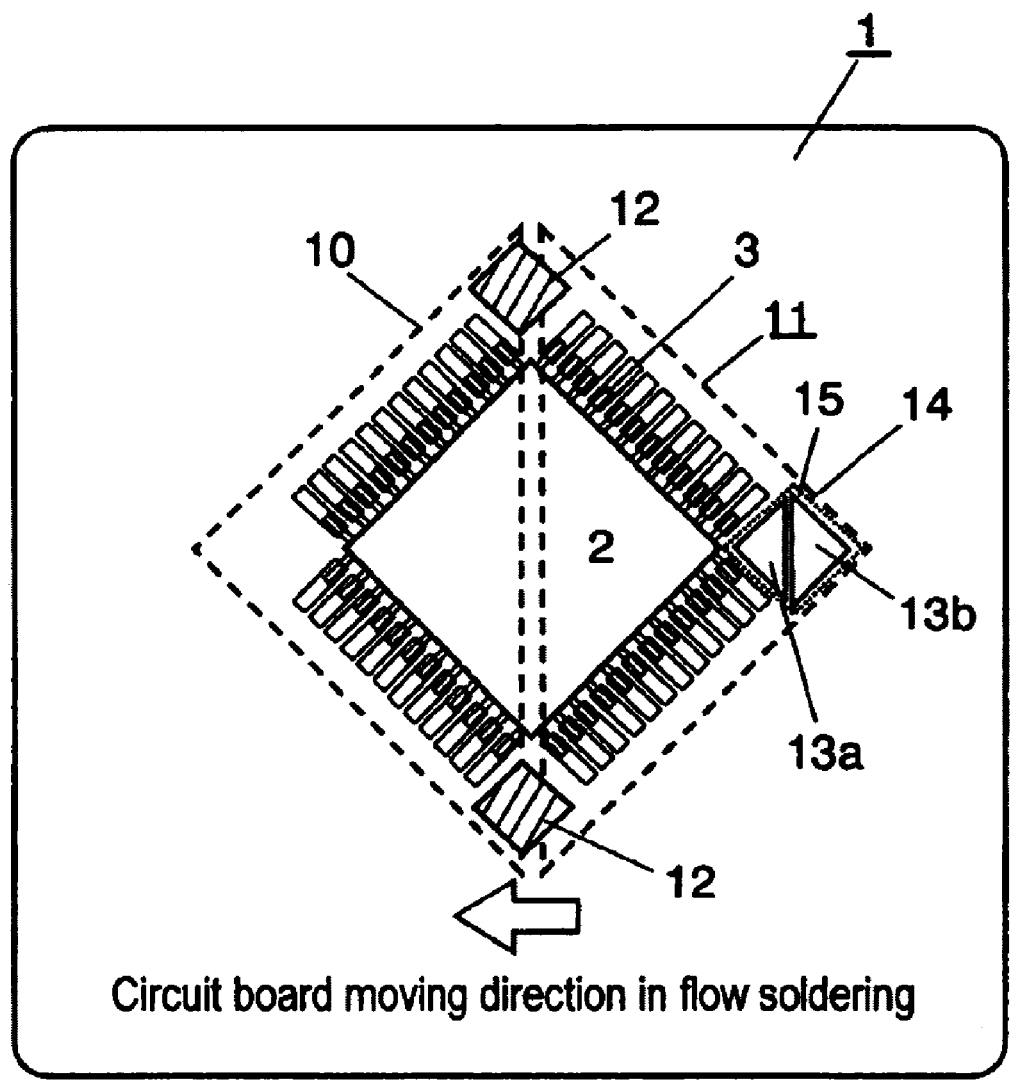
FIG. 1 is a schematic diagram showing a circuit board of a first preferred embodiment of the present invention.

The circuit board of the present invention has at least a QFPIC mounted thereon, and comprises a first solder leading land disposed at a portion on the circuit board corresponding to at least one of the corners of QFPIC, and a second solder leading land disposed next to and at an opposite to QFPIC side of the fist solder leading land.

In this construction, excessive solder accumulated at around rear ends of the leads and lands of QFPIC can be guided by surface tension to the first soldering land, and further more, to the second solder leading land in a case that an amount of the solder exceeds the capacity of the first solder leading land. As such, formation of a solder bridge can be prevented around leads and lands of QFPIC.

In another embodiment of the present invention, the first solder leading lands are disposed at portions on the circuit board corresponding to opposing two corners of QFPIC and the second solder leading lands next to and against the first solder leading lands on the opposite side of QFPIC.

With this construction, the circuit board can be moved with either corner, i.e. the corner where the first solder land and the second solder land is disposed, being as a front during the flow soldering process. This construction enhances degrees of freedom for soldering. For instance, when a plurality of pieces of circuit boards are formed on one board with one piece of circuit board 180 degrees rotated to next piece, the direction in which the QFP moves becomes opposite to one another accordingly, however, no special consideration is required for patterns when determining to which direction the circuit board should move at a time of flow soldering. This construction further facilitates pattern designing for the circuit board since QFPIC can be mounted without restriction of direction.

In still another embodiment of the present invention, the first solder leading land is divided into two pieces and the two pieces are disposed with a diagonal line to a corner of QFPIC, where the first solder leading lands are disposed, in between. And the two pieces are in alignment with the QFP leads disposed along the two sides which form the corner of QFPIC.

With this construction, excessive solder, which accumulates along the two sides forming the corner of QFPIC where the first and second solder leading lands are disposed, is absorbed by the first solder leading lands disposed adjacent to the final leads located at the rearmost of the lines of the groups of the leads; i.e. leads which are located at the rearmost when the circuit board moves toward the flow solder tank during the flow soldering process. Furthermore, if solder overflows from the first solder leading lands, it is then guided to the second solder leading land. Consequently, problems such as solder bridges forming around the groups of leads, especially in the area of the final leads, can be prevented effectively.

Moreover, even when solder bridges are formed simultaneously in the two rear sides of QFPIC between the final leads and the adjacent first solder leading lands, since the first solder leading lands are divided into two and allocated for the two different sides, short circuit of the electric connection can be avoided and thus connection stability further improves.

In yet another embodiment of the present invention, the first and second solder leading lands of the same shape against the center of QFPIC are disposed at each of the four corners of QFPIC.

It is easy to form the first and second solder leading lands of the same shape at the four corners of QFPIC. This construction enhances the degree of freedom regarding the direction in which the circuit board moves during flow soldering.

In the foregoing constructions, the second solder leading land can be the same as or larger than the first solder leading land.

Making the capacity of the second solder leading land larger than that of the first solder leading land facilitates flow of solder to the second solder leading land thereby enhancing effectiveness of solder bridge prevention.

In addition, at least one of the first and second solder leading lands can be provided with a through-hole formed at a section of the land of copper foil.

The through-hole helps release gas generated during soldering from the solder leading lands efficiently and thus suppresses incomplete soldering caused by gas bubbling. Consequently, quality of soldering can be further improved.

It is also possible to form the first solder leading lands, which are disposed in the first corner of QFPIC in alignment with the groups of leads lining up along the two sides of QFPIC, such that they taper down towards the direction of the first corner from either second or third corner, which are not diagonally opposite the first corner of QFPIC.

With this construction, excessive solder from the first solder leading land can be easily guided to the second solder leading land. Should excessive solder accumulate, it could be led to the second solder leading land effectively. Consequently, the possibility of back flow of excessive solder from the first solder leading land to the final leads or lands on the side of QFPIC is lowered, thus yields and reliability of the circuit board can be improved.

At least the second solder leading land is formed such that it tapers down toward the opposite direction to QFPIC against the first corner where the second solder leading land is disposed.

This shape helps cut out unnecessary solder which has been guided to the second solder leading land while the circuit board moves. Thus, the possibility that excessive solder remains on the circuit board and causes short circuit with other lands can be lowered significantly.

As for the lead-free solder, its inferior properties such as low in fluidity and poor wettability are cancelled out by the soldering method put forth by the present invention, and occurrence of solder bridges decreases. Using lead-free solder at the same time achieves environmentally friendly products.

The preferred embodiments of the present invention are described below with reference to the accompanying drawings. In the description the components which are of the same construction as that of the example of the prior art are labeled with the same numerals.

The First Preferred Embodiment

FIG. 1 shows the printed circuit board of the first preferred embodiment of the present invention. In the case of the solder leading land of the prior art as shown in FIG. 6, the whole amount of excessive solder needs to be accepted in one solder leading land without exception. In order to promote the flow of excessive solder to the solder leading land by surface tension of the solder itself, the area of the land and the level of the surface tension need to be optimized. Due to these problems, the amount of the solder guided to the solder leading land varies, consequently, solder bridges cannot be fully prevented.

In the present embodiment, the land is divided into first and second solder leading lands 13a and 13b, that are formed by a copper foil 14 and a solder resist 15 covering the copper foil 14, in order to guide excessive solder stepwise. With this construction, excessive solder is guided to the first solder leading land 13a at the rearmost ends of the sides of QFPIC against the direction of the flow soldering. Successively, the excessive solder is guided to the second solder leading land 13b. Thus the amount of solder remaining in the first solder leading land is reduced. Consequently, adhesion of solder flowed back from the solder leading land 13a to adjacent leads and lands of QFPIC and an occurrence of a formation of the solder bridges can be prevented.

In FIG. 1, the solder leading lands 13a and 13b are triangular, however, providing that they are disposed sequentially according to the direction in which the circuit board moves, they do not have to be triangular; they can be circular or rectangular. However, as shown in the same figure, at least the second solder leading land 13b is preferably triangular or has a shape tapering off toward the direction opposite to the direction in which the circuit board moves during flow soldering.

The Second Preferred Embodiment

Figure 2:
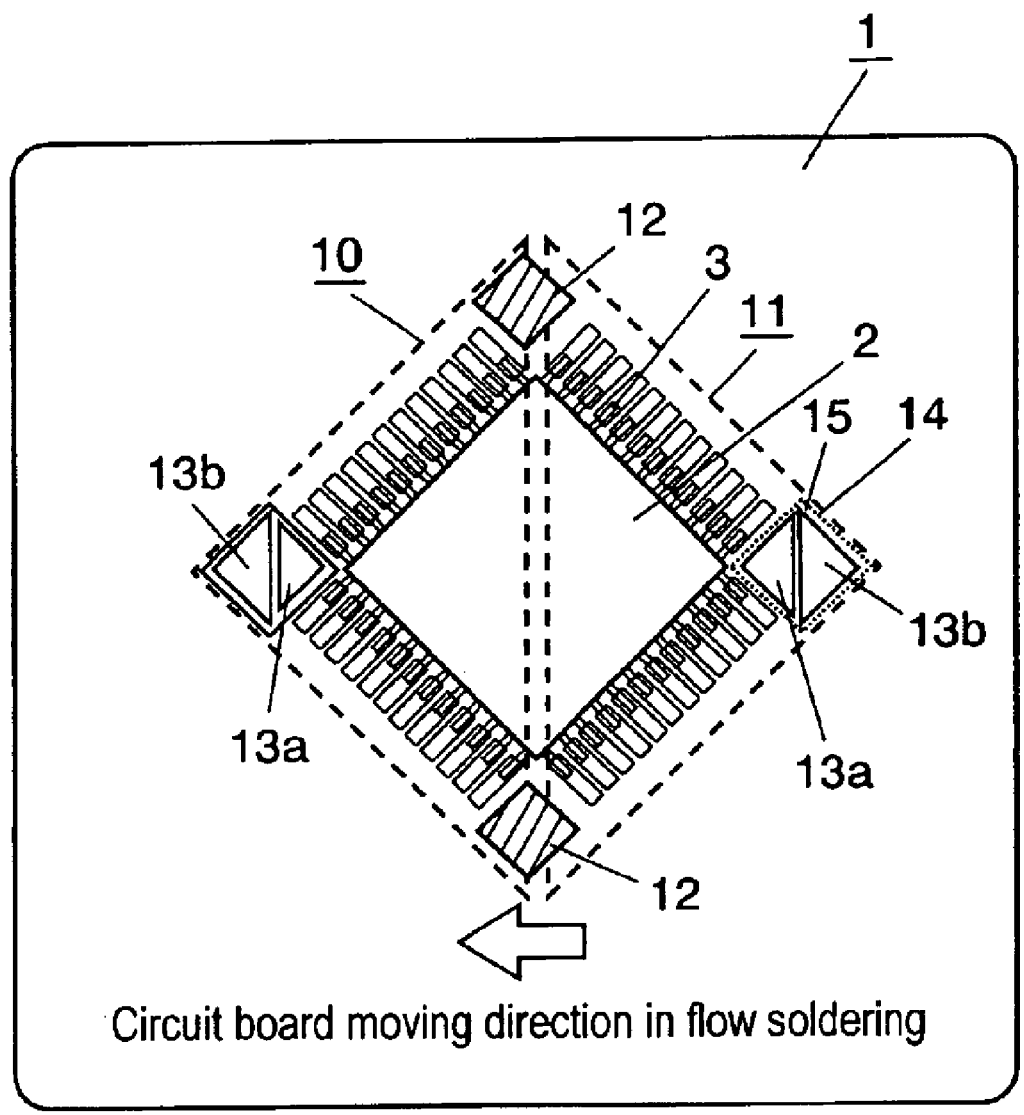
FIG. 2 is a schematic diagram showing a circuit board of a second preferred embodiment of the present invention.

FIG. 2 shows a circuit board of the second preferred embodiment of the present invention. In the present embodiment, a triangular second solder leading land 13b is disposed against a triangular first solder leading land 13a. The second solder leading land 13b is larger than the first solder leading land 13a. This construction facilitates a flow of solder toward the second solder leading land 13b, and effectively prevents adhesion of solder caused by the solder flowing back from the second solder leading land 13a. In the present preferred embodiment, also, the lands do not have to be triangular.

Disposing the first and second solder leading lands 13a and 13b on opposing two corners against the center of QFPIC 2 as shown in FIG. 2 achieves soldering of high quality even when a plurality of circuit boards being formed on one board at opposite directions to one another are soldered simultaneously in a flow soldering line.

The Third Preferred Embodiment

Figure 3A:
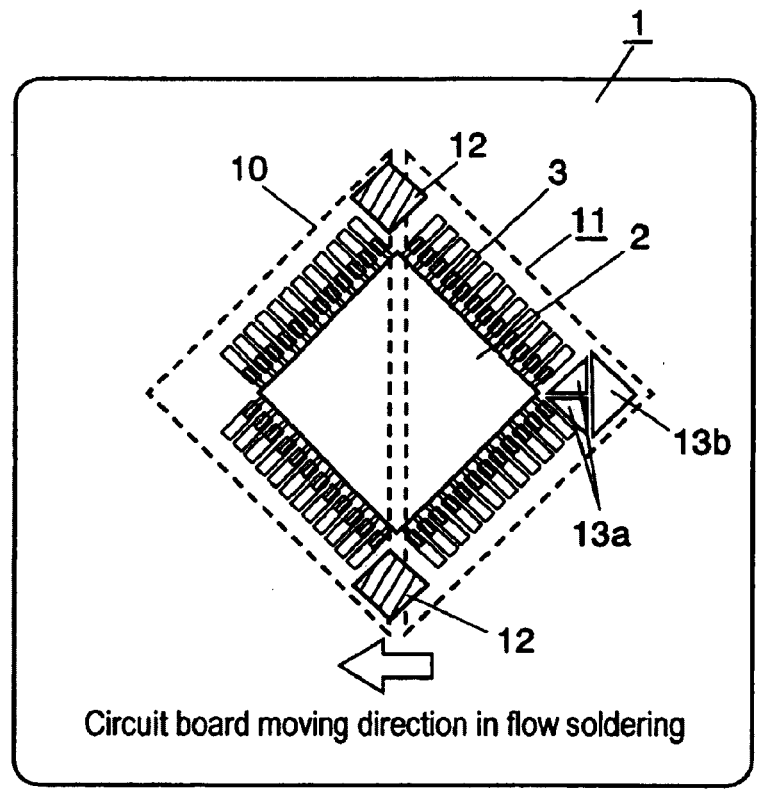
FIG. 3A is a schematic diagram showing a circuit board of a third preferred embodiment of the present invention.

FIG. 3A shows a circuit board of the third preferred embodiment of the present invention.

Figure 3B:
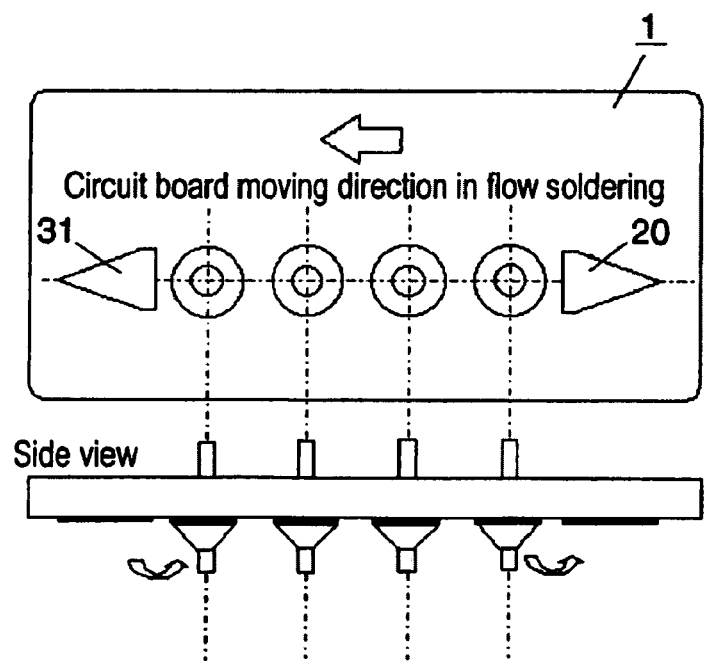
FIG. 3B is a schematic diagram showing solder leading lands and a solder guiding land.

With reference to FIG. 3B, a solder leading land and a solder guiding land are described below.

As shown in FIG. 3B, a solder leading land 20 is disposed in alignment with the central axis of lines of pins, which should be protected from solder bridges, on the rear side of the circuit board against the direction in which it moves. The leading land tapers down as the distance from the land needing to be protected from solder bridges becomes larger. The purpose of this shape is to prevent adverse current of solder to the land needing to be protected by removing flow solder gradually from the land.

A solder guiding land 31 guides solder to the land which needs to be soldered. The solder guiding land 31 is disposed where the flow of solder is slow or wettability is low in order to improve soldering. Because the function of the solder guiding land 31 contrasts with the solder leading land 20, it is effective to form the solder guiding land 31 such that its area expands toward the land which needs to be soldered as shown in FIG. 3B.

In accordance with the third preferred embodiment of the present invention, in order to ensure the effect of the solder leading land, the triangular first solder leading lands 13a which taper off toward the rear side against the direction of the soldering, or in other words, taper off as the distance from the land becomes larger, are disposed respectively on the axes of the leads lining up along the two rear sides. Behind these two solder leading lands 13a disposed one each on the two rear sides is the second solder leading land 13b which combines the two solder leading lands 13a and leads solder toward a rear side. The second solder leading land 13b is also triangular with area tapering off as the distance from the first solder leading lands 13a becomes larger. As such, these three triangles form a solder leading land. The land comprising three triangles can be produced by resist-printing on a piece of rectangular copper foil and dividing it into three. However, in the present invention, the land is produced by cutting the copper foil into required forms as shown in FIG. 3A.

According to the above structure, as the shapes of the solder leading lands are optimized in a manner described above, flow of excessive solder is led more effectively and a short circuit between the final leads can be prevented even when the two rear sides simultaneously suffer solder bridges between the final leads and the neighboring first solder leading lands 13a. As electrical connection is secured, higher stability in soldering and improved yields can be possible.

While the shape of the solder leading lands is not limited, it is preferable to make it according to the shapes shown in FIGS. 3A and 3B.

Figure 4:
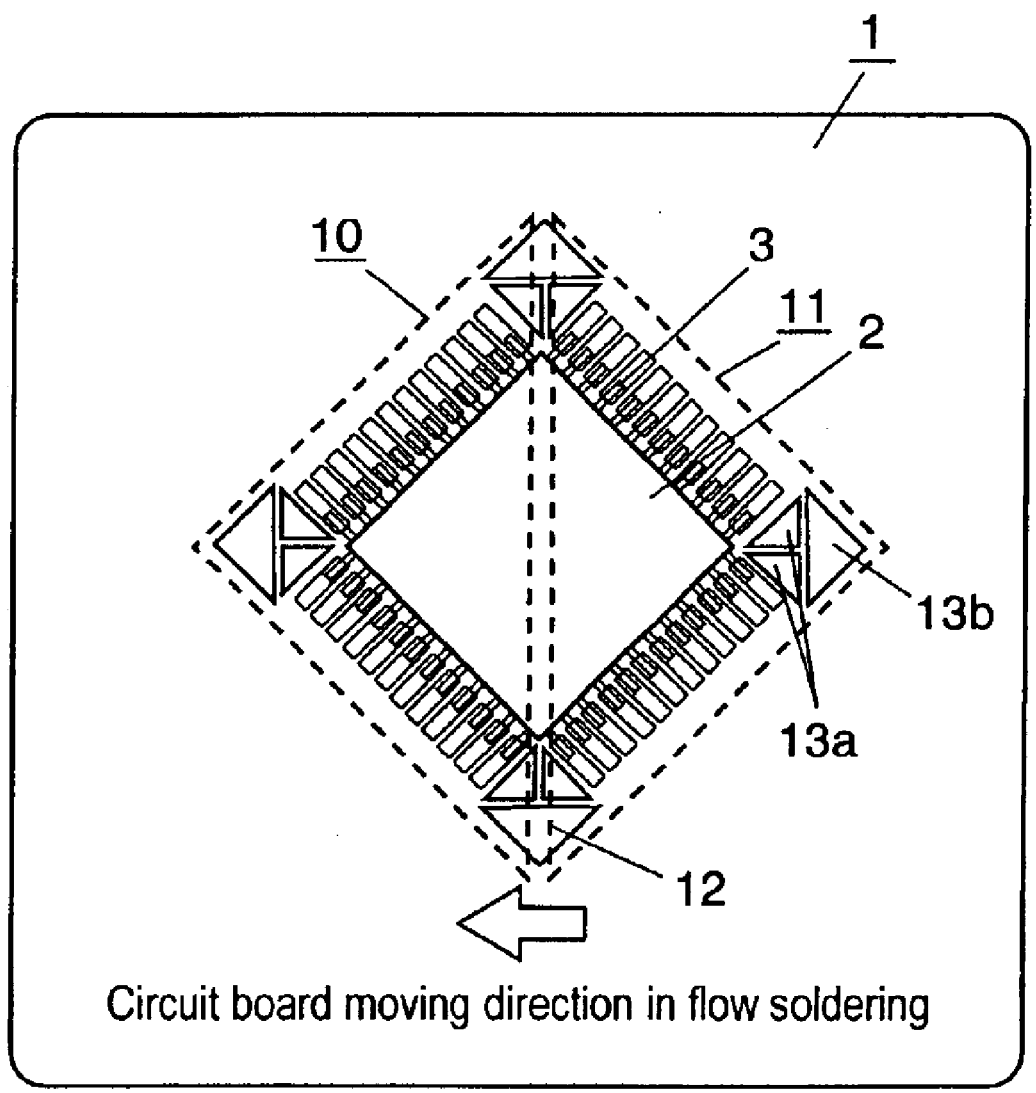
FIG. 4 is a schematic diagram showing a circuit board of the third preferred embodiment of the present invention.

As FIG. 4 shows, if the solder leading lands described above are disposed in all of the four corners, the circuit board can be placed freely without limitation regarding the direction in which the circuit board moves for flow soldering. As such, even when a plurality of circuit boards are formed on one board with 180 degrees rotation to one another and direction in which each circuit board moves becomes opposite accordingly, soldering can be conducted without any limitation. During the designing process of the circuit board, pattern designing can be expedited since direction of QFPIC does not have to be put into consideration.

In this preferred embodiment, basic shape of the lands is triangle. While this shape is easily patterned and looks beautiful, the shape is not limited to triangle.

The Fourth Preferred Embodiment

Figure 5:
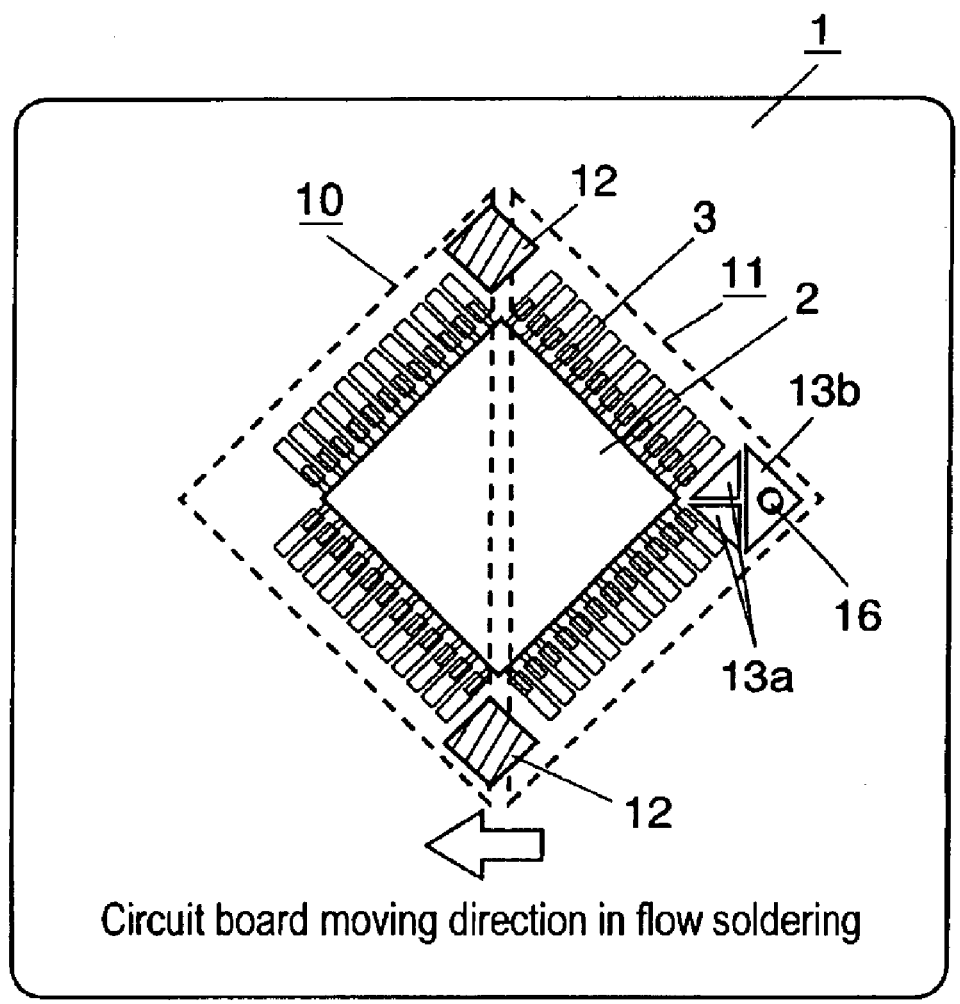
FIG. 5 is a schematic diagram showing a circuit board of a fourth preferred embodiment of the present invention.

FIG. 5 shows a circuit board of the fourth preferred embodiment of the present invention. In the present embodiment, the second solder leading land 13b disposed at the rear end according to the third preferred embodiment is provided with a through-hole 16 which penetrates through the circuit board. The through-hole may also be provided to the first solder leading land 13a.

The through-hole helps release gas which is generated during the process of soldering, thereby preventing incomplete soldering which could otherwise be caused by gas bubbling and achieving soldering with superior stability. As has been the case with the previous embodiments, the shape of the lands is not limited to particular shape.

In the previous embodiments thus far described, QFPIC is taken up as an example of the application of the present invention, however, the present invention is also applicable to circuit boards on which components are mounted at narrow lead pitch.

INDUSTRIAL APPLICABILITY

According to the circuit board of the present invention with the first and second solder leading lands, excessive solder guided to the second solder leading land can be cut off smoothly against the movement of the circuit board. Consequently, the possibility that excessive solder remains on the circuit board and triggers a short circuit with another land can be significantly reduced. In this manner, stable soldering of QFPIC can be achieved even in a flow soldering process.

Application of the present invention to soldering using lead-free solder offsets inferior properties of the lead-free solder such as low fluidity and poor wettability, and thus further reduces occurrence of solder bridges. Furthermore, environmentally-friendly products can be constructed.

What is claimed is:

1. A circuit board for surface mounting an electronic component with narrow lead pitches using solder, said circuit board having a rear end designated in accordance with a direction in which the board is intended to move, the circuit board comprising:

a first solder leading land and a second solder leading land located on the circuit board near a corner located at said rear end of the circuit board, and for facilitating mounting of an electronic component thereon, wherein the first solder leading land is located on the circuit board adjacent to a land for mounting an electronic component, the first solder leading land having a rear end, said solder leading lands for locating such an electronic component therebetween, and the second solder leading land is located adjacent the rear end of the first solder leading land.

2. The circuit board of claim 1, wherein the electronic component is a quad flat package integrated circuits ("QFPIC").

3. The circuit board of claim 2, wherein said first and second solder leading lands are located on the circuit board corresponding to at least two opposite corners of the QFPIC, the two opposite corners forming a diagonal line.

4. The circuit board of claim 2, wherein said first solder leading land is divided into two portions corresponding to two sides of the QFPIC and respectively located in alignment with each of the two sides.

5. The circuit board of claim 1, wherein an area of the second solder leading land is at least equal to an area of the first solder leading land.

6. The circuit board of claim 1, wherein at least one of the first and the second solder leading lands has a through-hole which penetrates the substrate.

7. The circuit board of claim 1, wherein at least the first solder leading land tapers off toward a direction opposite the electronic component.

8. The circuit board of claim 1, wherein at least the second solder leading land tapers off toward a direction opposite to said first solder leading land.

9. The circuit board of claim 1, wherein the solder is lead-free.

10. A method for flow soldering a surface mounted electronic component having narrow lead pitches to a circuit board, said circuit board having a rear end designated in accordance with a direction in which the board is intended to move, the board comprising a first solder leading land and a second solder leading land located on the circuit board near a corner located at said rear end of the circuit board, and for facilitating mounting of an electronic component therebetween, wherein the first solder leading land is located on the circuit board adjacent to a land for mounting an electronic component, the first solder leading land having a rear end, said solder leading lands for locating such electronic component therebetween, and the second solder leading land is located adjacent the rear end of the first solder leading land, the method comprising:

positioning the second solder leading land at the rear end of the circuit board against a direction of a movement of the circuit board when the circuit board moves toward a solder flow.

* * * * *